United States Patent
Kuo et al.

(10) Patent No.: US 8,450,049 B2
(45) Date of Patent: May 28, 2013

(54) PROCESS FOR FORMING AN ANTI-OXIDANT METAL LAYER ON AN ELECTRONIC DEVICE

(75) Inventors: Chih-Ming Kuo, Xinfeng Township, Hsinchu County (TW); Yie-Chuan Chiu, Hsinchu (TW); Cheng-Hung Shih, Lugang Township, Changhua County (TW); Lung-Hua Ho, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 265 days.

(21) Appl. No.: 13/024,992

(22) Filed: Feb. 10, 2011

(65) Prior Publication Data

US 2012/0208129 A1 Aug. 16, 2012

(51) Int. Cl.
*G03F 7/26* (2006.01)
(52) U.S. Cl.
USPC .......................................... 430/313
(58) Field of Classification Search
USPC .................................. 430/311, 313
See application file for complete search history.

(56) References Cited

U.S. PATENT DOCUMENTS

2006/0292851 A1\* 12/2006 Lin et al. ...................... 438/618

\* cited by examiner

*Primary Examiner* — Kathleen Duda
(74) *Attorney, Agent, or Firm* — Jackson IPG PLLC (57) ABSTRACT

A process for forming an anti-oxidant metal layer on an electronic device comprises the steps of providing a substrate; forming a conductive metal layer on the substrate; forming a first photoresist layer on the conductive metal layer; patterning the first photoresist layer to form apertures and first grooves; forming a connecting member having a top surface and a lateral surface in the aperture and the first groove; removing the first photoresist layer to reveal the top surface and the lateral surface; forming a second photoresist layer on the conductive metal layer; patterning the second photoresist layer to form apertures and second grooves; forming an anti-oxidant metal layer in aperture and second groove, the anti-oxidant metal layer covers the top surface and the lateral surface of the connecting member; and removing the second photoresist layer to reveal the anti-oxidant metal layer and the conductive metal layer.

13 Claims, 8 Drawing Sheets

PROCESS FOR FORMING AN ANTI-OXIDANT METAL LAYER ON AN ELECTRONIC DEVICE

FIELD OF THE INVENTION

The present invention is generally relating to a process for forming an anti-oxidant metal layer on an electronic device. More particularly, the process may prevent the electronic device from oxidation phenomenon.

BACKGROUND OF THE INVENTION

Figure 1:
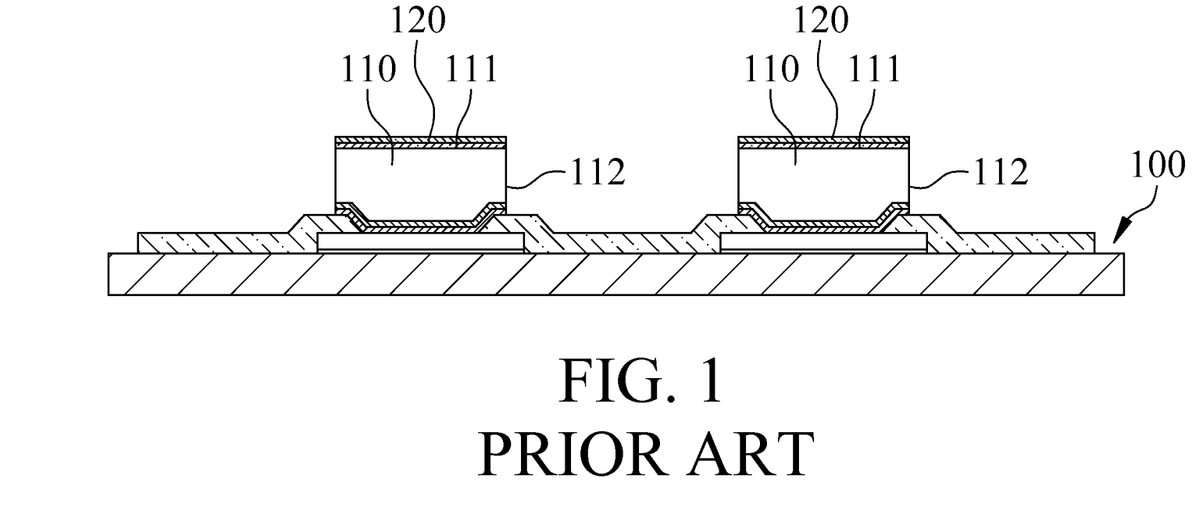
FIG. 1 is a conventional schematic diagram illustrating a plurality of bumps formed on a substrate.

With reference to FIG. 1, in conventional bump process, a plurality of bumps 110 are formed on a substrate 100, and each of the bumps 110 comprises a top surface 111 and a lateral surface 112. A connecting layer 120 is formed on the top surface 111 of each of the bumps 110, wherein the bumps 110 are copper bumps, and the connecting layer 120 can be a nickel-gold layer. When the lateral surface 112 of each of the bumps 110 is in contact with water mist, a short phenomenon is occurred between adjacent bumps 110 via electron migration. Besides, for the reason that the top surface 111 of each of the bumps 110 is covered by the connecting layer 120, the corrosion resistant ability of the lateral surface 112 of each of the bumps 110 is far worse than that of the top surface 111. Furthermore, the thinning process of the substrate 100 may lead a bending phenomenon to influence the following test and cutting processes.

SUMMARY

The primary object of the present invention is to provide a process for forming an anti-oxidant metal layer on an electronic device, wherein the process comprises the steps of providing a substrate having a plurality of bond pads and a protective layer; forming a conductive metal layer on the substrate; forming a first photoresist layer on the conductive metal layer; patterning the first photoresist layer to form a plurality of apertures and a plurality of first grooves; forming a connecting member in each of the apertures and each of the first grooves, each of the connecting members comprises a top surface and a lateral surface; removing the first photoresist layer to reveal the top surface and the lateral surface of each of the connecting members; forming a second photoresist layer on the conductive metal layer, each of the connecting members is covered by the second photoresist layer; patterning the second photoresist layer to form a plurality of apertures and a plurality of second grooves, wherein the top surface and the lateral surface of each of the connecting members and the conductive metal layer are revealed by each of the apertures and each of the second grooves; forming an anti-oxidant metal layer in each of the apertures and each of the second grooves, the anti-oxidant metal layer covers the top surface, the lateral surface of each of the connecting members and the conductive metal layer revealed by each of the apertures and each of the second grooves; removing the second photoresist layer to reveal the anti-oxidant metal layer and the conductive metal layer; removing the conductive metal layer which is not covered by each of the connecting members and the anti-oxidant metal layer.

Via the following steps of forming the first photoresist layer; patterning the first photoresist layer; forming the connecting members (such as bump, redistribution pad or redistribution trace) in the apertures and the grooves; covering the connecting members by means of the second photoresist layer; patterning the second photoresist layer to reveal the top surface and the lateral surface of each of the connecting members; and eventually forming the anti-oxidant metal layer on the top surface and the lateral surface of each of the connecting members, this invention may prevent a short phenomenon of the connecting members caused by electron migration. Besides, forming the anti-oxidant metal layer on the top surface and the lateral surface of each of the connecting members may increase the corrosion resistant ability for the connecting members.

DESCRIPTION OF THE DRAWINGS

FIG. 2G1 is a schematic diagram illustrating a process of forming a second photoresist layer on the conductive metal layer in accordance with a preferred embodiment of this invention.

FIG. 2G2 is a schematic diagram illustrating a process of forming a second photoresist layer on the conductive metal layer in accordance with another preferred embodiment of this invention.

FIG. 2H1 is a schematic diagram illustrating a process of patterning the second photoresist layer in accordance with a preferred embodiment of this invention.

FIG. 2H2 is a schematic diagram illustrating a process of patterning the second photoresist layer in accordance with another preferred embodiment of this invention.

FIG. 2I1 is a schematic diagram illustrating a process of forming an anti-oxidant metal layer in third apertures, fourth apertures and second grooves of the second photoresist layer in accordance with a preferred embodiment of this invention.

FIG. 2I2 is a schematic diagram illustrating a process of forming an anti-oxidant metal layer in third apertures, fourth apertures and second grooves of the second photoresist layer in accordance with another preferred embodiment of this invention.

DETAILED DESCRIPTION OF THE INVENTION

Figure 2A:
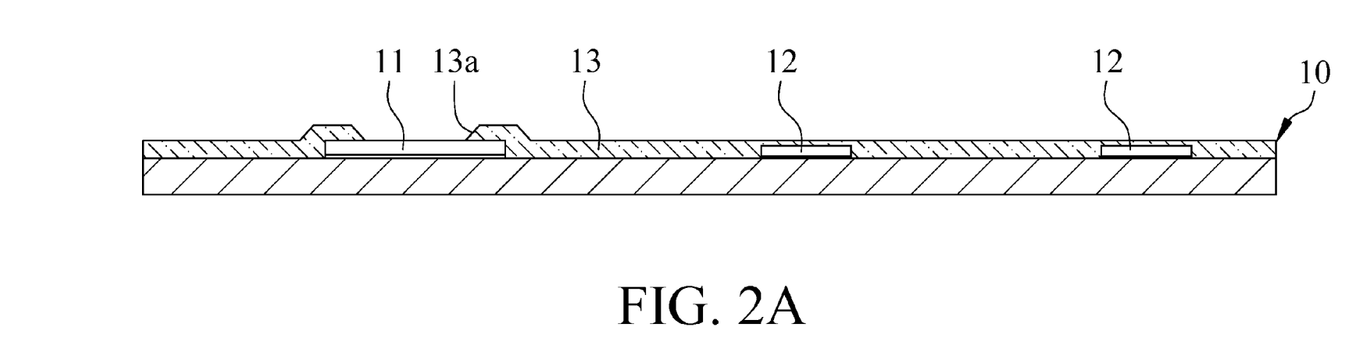
FIG. 2A is a schematic diagram illustrating a process of providing a substrate in accordance with a preferred embodiment of this invention.
Figure 2B:
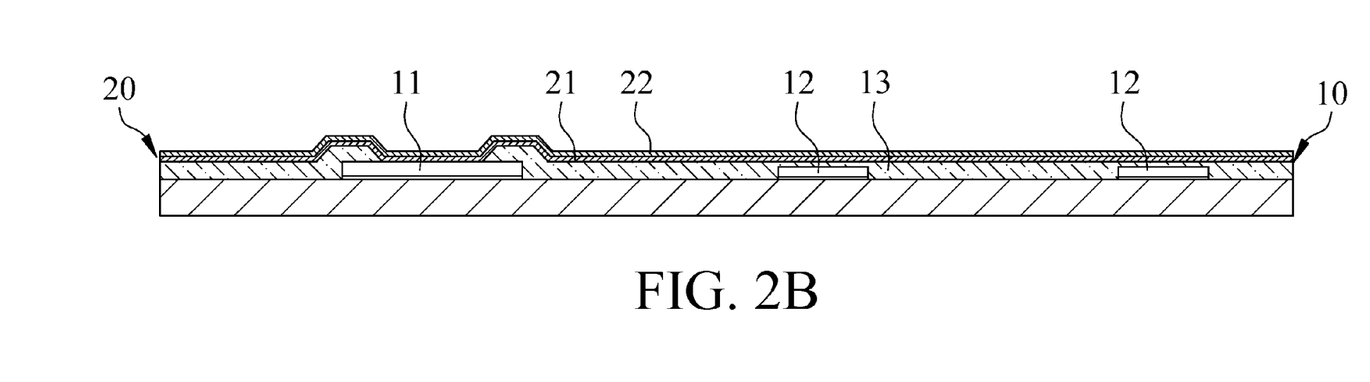
FIG. 2B is a schematic diagram illustrating a process of forming a conductive metal layer on the substrate in accordance with a preferred embodiment of this invention.
Figure 2C:
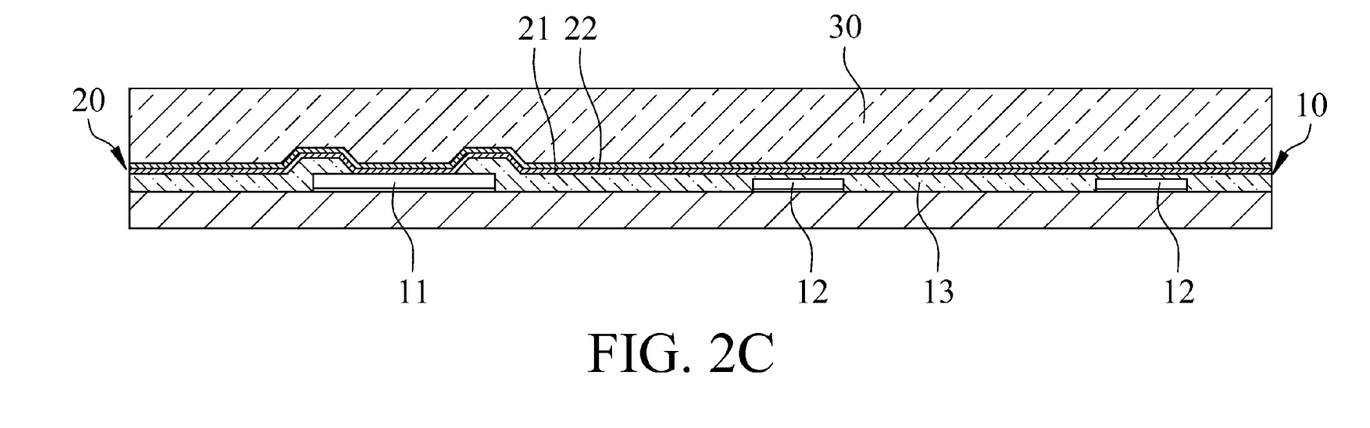
FIG. 2C is a schematic diagram illustrating a process of forming a first photoresist layer on the conductive metal layer in accordance with a preferred embodiment of this invention.
Figure 2D:
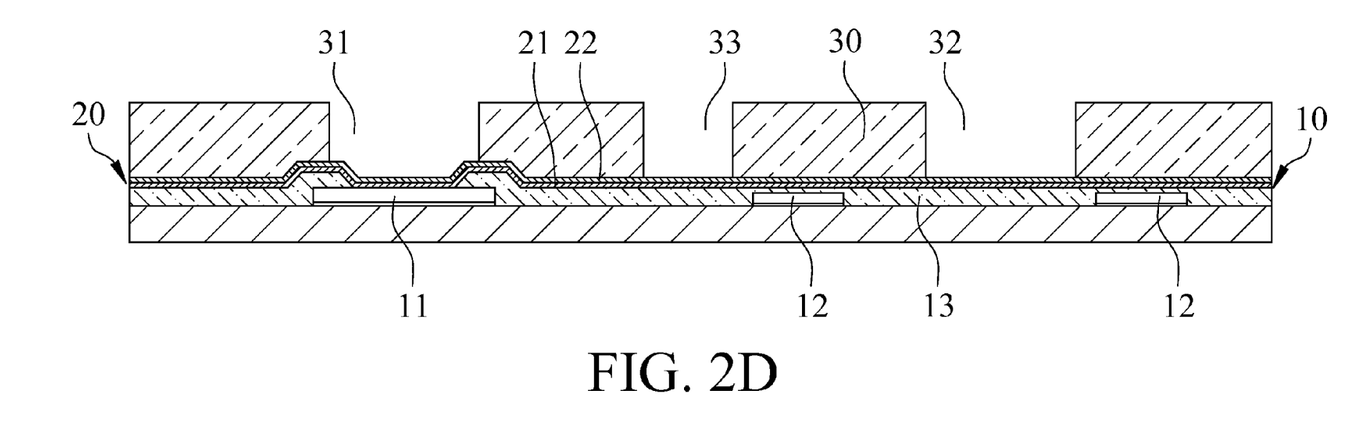
FIG. 2D is a schematic diagram illustrating a process of patterning the first photoresist layer in accordance with a preferred embodiment of this invention.
Figure 2E:
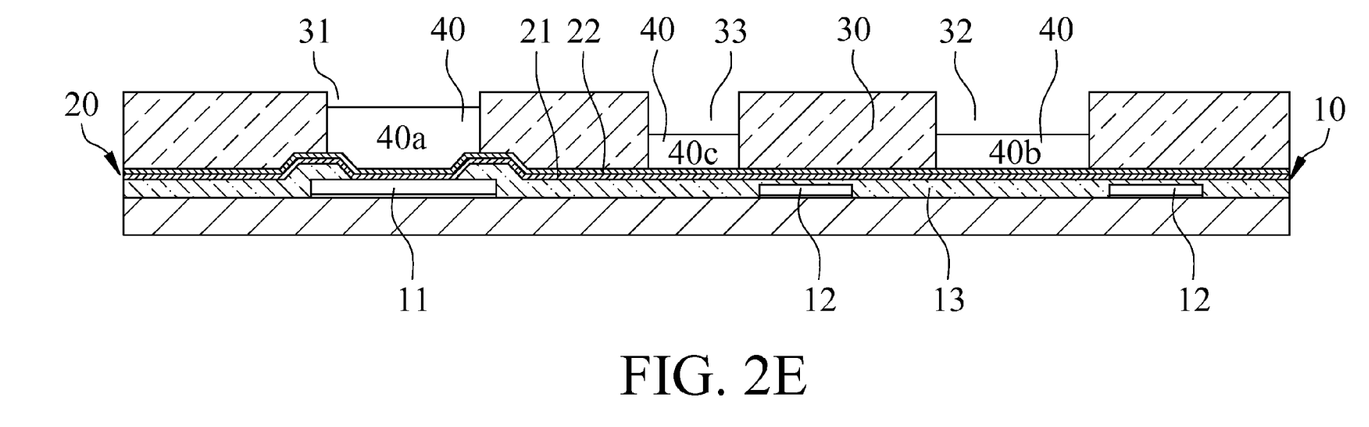
FIG. 2E is a schematic diagram illustrating a process of forming connecting members in first apertures, second apertures and first grooves of the first photoresist layer in accordance with a preferred embodiment of this invention.
Figure 2F:
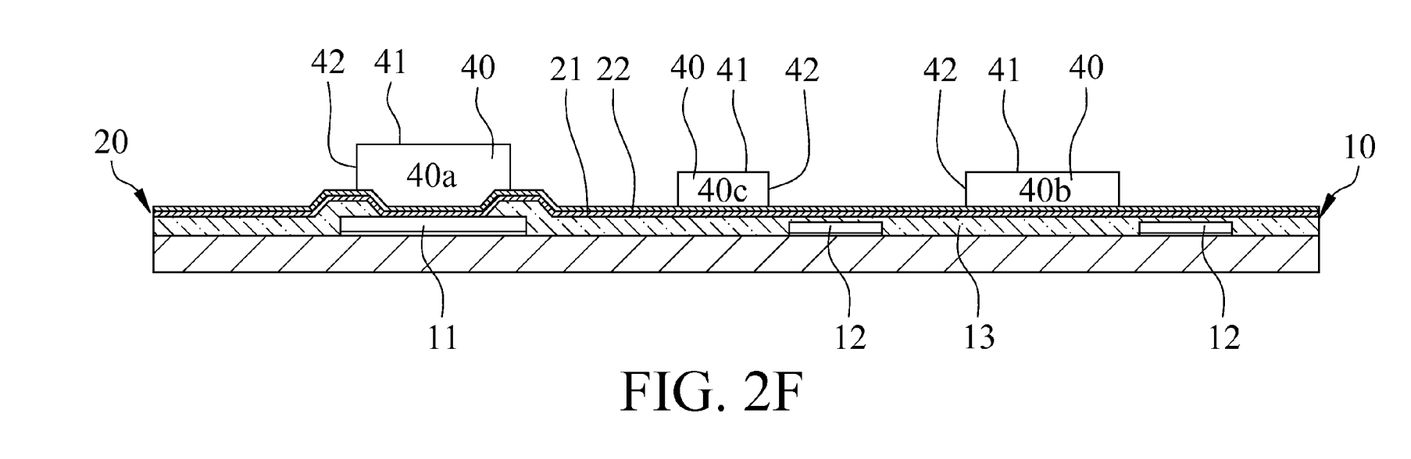
FIG. 2F is a schematic diagram illustrating a process of removing the first photoresist layer in accordance with a preferred embodiment of this invention.
Figure 2G:
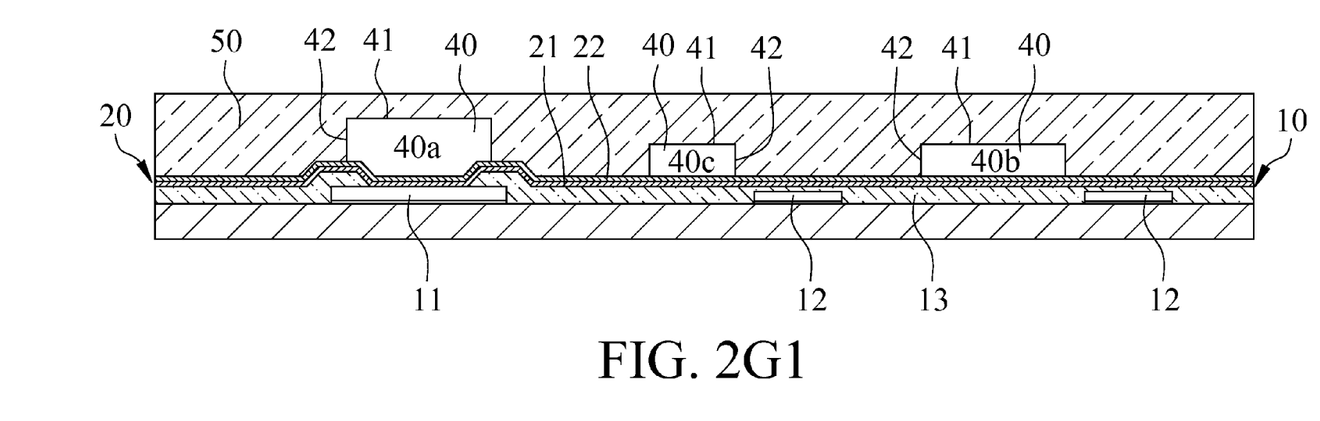
Figure 2G:
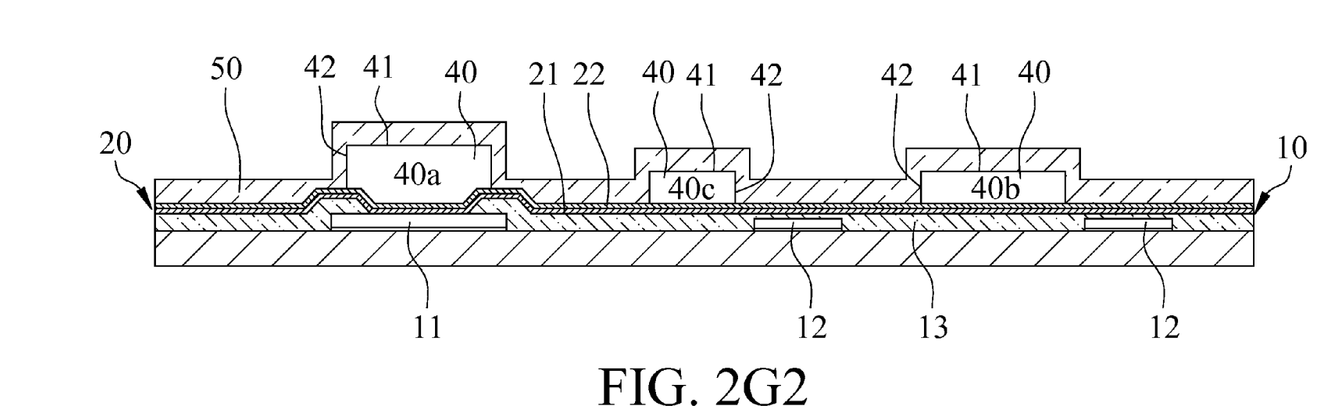
Figure 2H:
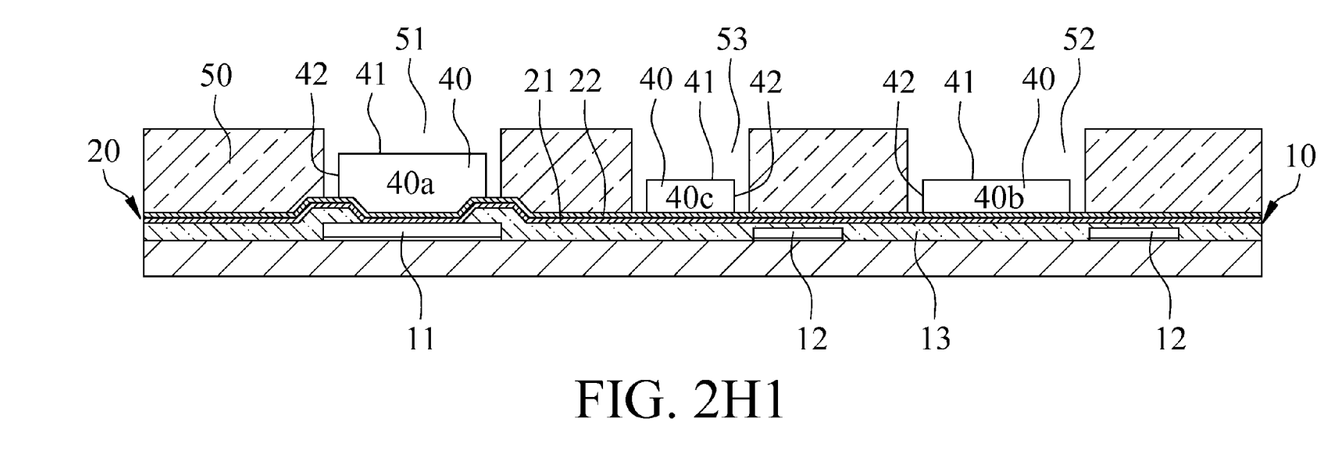
Figure 2H:
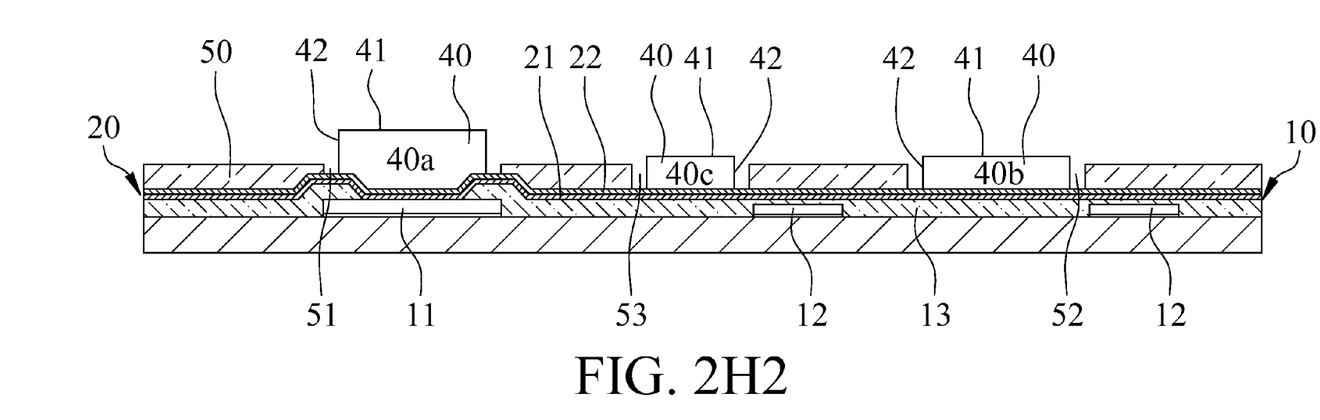

With reference to FIGS. 2A to 2K, FIGS. 2A to 2K represent a process diagram of forming an anti-oxidant metal layer on an electronic device. First, with reference to FIG. 2A, providing a substrate 10 having a plurality of bond pads 11, a plurality of traces 12 and a protecting layer 13, wherein the protecting layer 13 comprises a plurality of openings 13a and covers the traces 12, and the bond pads 11 are revealed by the openings 13a. In this embodiment, the substrate 10 can be a wafer, and the material of the protecting layer 13 is made by inorganic compound (such as Silicon Oxide, Silicon Nitride or phosphorus silicate glass) or organic compound (such as polyimide). Next, with reference to FIG. 2B, forming a conductive metal layer 20 on the substrate 10, the bond pads 11 and the protecting layer 13 are covered by the conductive metal layer 20, and the bond pads 11 are electrically connected with the conductive metal layer 20. The conductive metal layer 20 is formed on the substrate 10 by method of sputtering and comprises a first metal layer 21 and a second metal layer 22a. Preferably, the first metal layer 21 can be chosen from Ti, Cr, Ni or TiW, and the second metal layer 22 can be chosen from Cu, Cr/Cu, Au or Pd. The first metal layer 21 is located between the substrate 10 and the second metal layer 22. Thereafter, with reference to FIG. 2C, forming a first photoresist layer 30 on the conductive metal layer 20, the conductive metal layer 20 is covered by the first photoresist layer 30, and the first photoresist layer 30 can be a positive photoresist. Next, with reference to FIG. 2D, patterning the first photoresist layer 30 to form a plurality of first apertures 31, a plurality of second apertures 32 and a plurality of first grooves 33, wherein the first apertures 31 are located on top of the bond pads 11, and the conductive metal layer 20 is revealed by the first apertures 31, the second apertures 32 and the first grooves 33. In this embodiment, the process of FIG. 2D is achieved through a mask (not shown in Fig.) for exposure and development. Thereafter, with reference to FIG. 2E, forming a connecting member 40 in each of the first apertures 31, each of the second apertures 32 and each of the second grooves 33, in this embodiment, the connecting member 40 can be the electronic device, the material of the connecting member 40 is copper, and each of the connecting members 40 is electrically connected with the conductive metal layer 20. In this embodiment, in the step of forming the connecting member 40, each of the connecting members 40 formed in each of the first apertures 31 is a bump 40a, each of the connecting members 40 formed in each of the second apertures 32 is a redistribution pad 40b, and each of the connecting members 40 formed in each of the first grooves 33 is a redistribution trace 40c. Each of the connecting members 40 comprises a top surface 41 and a lateral surface 42, and each of the connecting members 40 (bump 40a, redistribution pad 40b and redistribution trace 40c) is formed in each of the first apertures 31, each of the second apertures 32 and each of the second grooves 33 by method of plating. After that, with reference to FIG. 2F, removing the first photoresist layer 30 to reveal the top surface 41 and the lateral surface 42 of each of the connecting members 40 (bump 40a, redistribution pad 40b and redistribution trace 40c). Afterward, with reference to FIGS. 2G1 and 2G2, forming a second photoresist layer 50 on the conductive metal layer 20, referring to FIG. 2G1, the forming method of the second photoresist layer 50 is via spin coating, and each of the connecting members 40 is covered by the second photoresist layer 50. Or, with reference to FIG. 2G2, the forming method of the second photoresist layer 50 is via spray coating, and each of the connecting members 40 is covered by the second photoresist layer 50. The second photoresist layer 50 can be a positive photoresist. After that, with reference to FIGS. 2H1 and 2H2, first, with reference to FIG. 2H1, patterning the second photoresist layer 50 to form a plurality of third apertures 51, a plurality of fourth apertures 52 and a plurality of second grooves 53, wherein the third apertures 51 are located on top of the bond pads 11. The top surface 41 and the lateral surface 42 of each of the connecting members 40 are revealed by the each of the third apertures 51, each of the fourth apertures 52 and each of the second grooves 53. Besides, the third apertures 51, the fourth apertures 52 and the second grooves 53 reveal the conductive metal layer 20 disposed therein. In this embodiment, each of the third apertures 51 reveals the top surface and the lateral surface of each of the bumps 40a, each of the fourth apertures 52 reveals the top surface and the lateral surface of each of the redistribution pads 40b, and each of the second grooves 53 reveals the top surface and the lateral surface of each of the redistribution traces 40c. In this embodiment, the process of FIG. 2H1 is achieved through a mask (not shown in Fig.) for exposure and development. Or, with reference to FIG. 2H2, the top surface 41 and the lateral surface 41 of each of the connecting members 40 are revealed by each of the third apertures 51, each of the fourth apertures 52 and each of the second grooves 53. The third apertures 51, the fourth apertures 52 and the second grooves 53 reveal the conductive metal layer 20 disposed therein. Next, with reference to FIGS. 2I1 and 2I2, forming an anti-oxidant metal layer 60 in each of the third apertures 51, each of the fourth apertures 52 and each of the second grooves 53, the top surface 41 and the lateral surface 42 of each of the connecting members 40 are covered by the anti-oxidant metal layer 60. In this embodiment, the anti-oxidant metal layer 60 covers the conductive metal layer 20 revealed by each of the third apertures 51, each of the fourth apertures 52 and each of the second grooves 53 to form a connecting interface A between the anti-oxidant metal layer 60 and the conductive metal layer 20 beneath the anti-oxidant metal layer 60. The anti-oxidant metal layer 60 is formed on the top surface 41 and the lateral surface 42 of each of the connecting members 40 by method of plating. In this embodiment, the anti-oxidant metal layer 60 comprises a third metal layer 61 and a fourth metal layer 62, wherein the third metal layer 61 can be chosen from Ni, and the fourth metal layer 62 can be chosen from Au or Pd. The third metal layer 61 is located between each of the connecting members 40 and the fourth metal layer 62. Subsequently, with reference to FIG. 2J, to remove the second photoresist layer 50 to reveal the anti-oxidant metal layer 60 and the conductive metal layer 20. Eventually, with reference to FIG. 2K, using the connecting members 40 and the anti-oxidant metal layer 60 as a mask to remove the conductive metal layer 20 which is not covered by each of the connecting members 40 and the anti-oxidant metal layer 60 to enable the conductive metal layer 20 positioned above each of the bond pads 11 to be an under bump metallurgy layer 20A. In this embodiment, the method for removing the conductive metal layer 20 is etching.

Figure 2I:
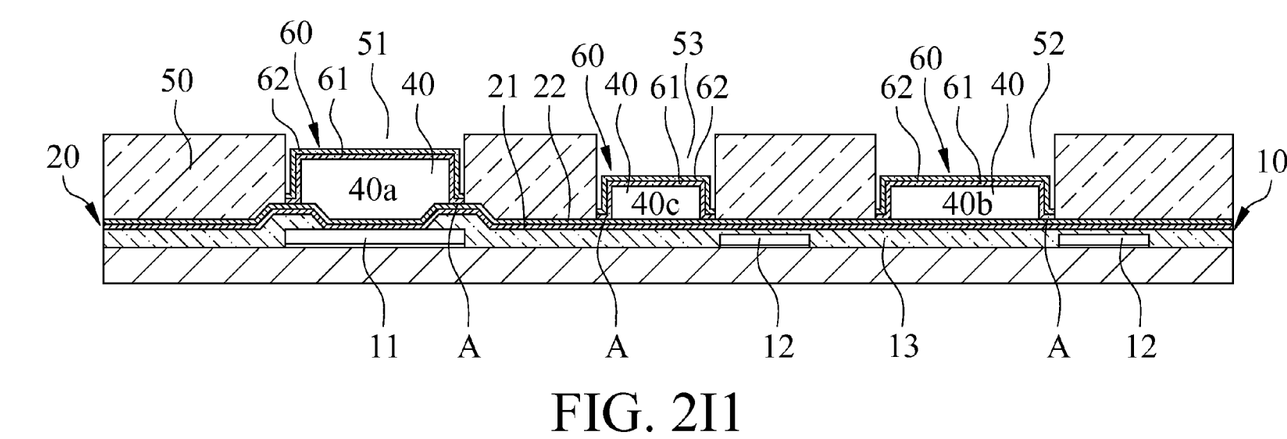
Figure 2I:
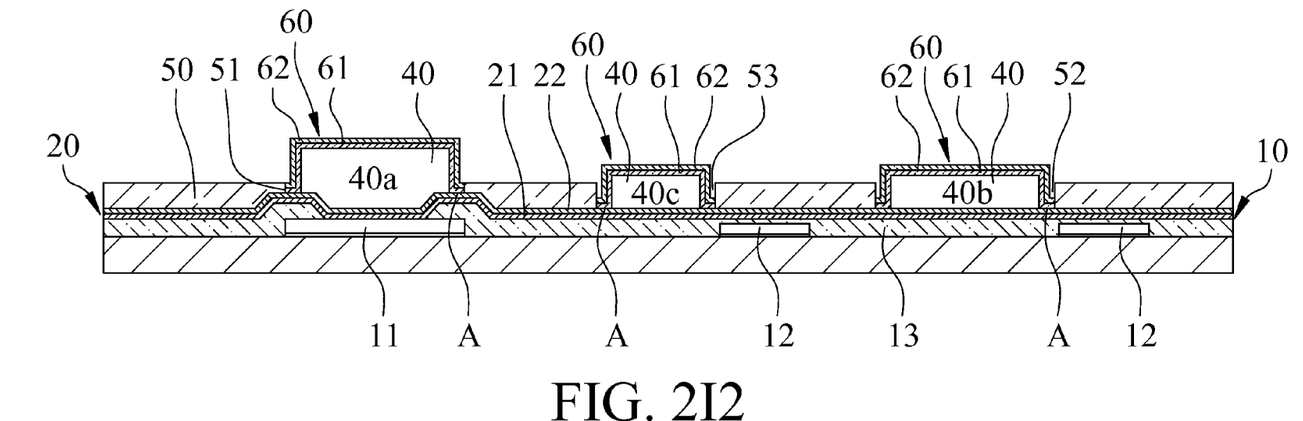
Figure 2J:
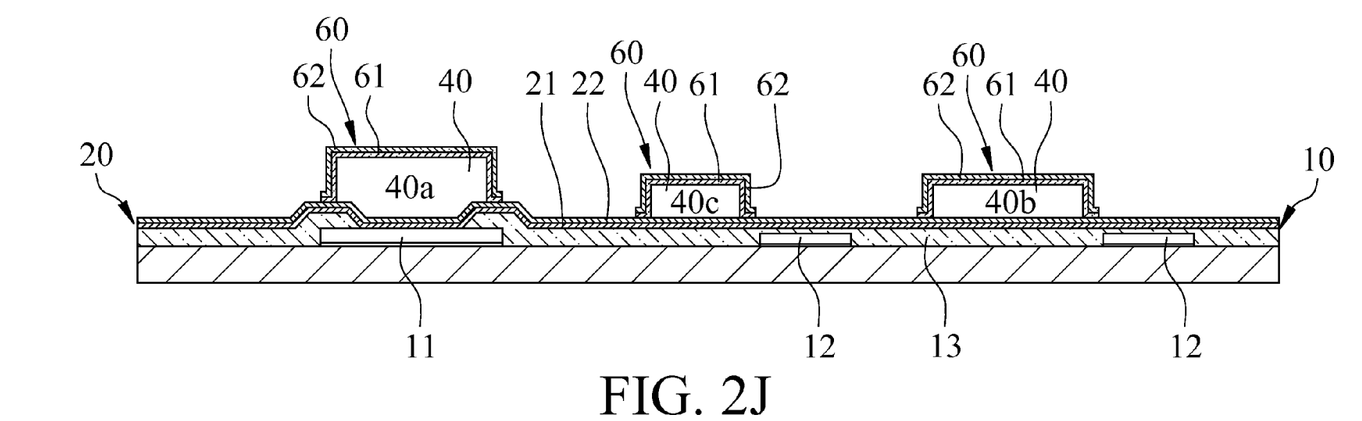
FIG. 2J is a schematic diagram illustrating a process of removing the second photoresist layer in accordance with a preferred embodiment of the present invention.
Figure 2K:
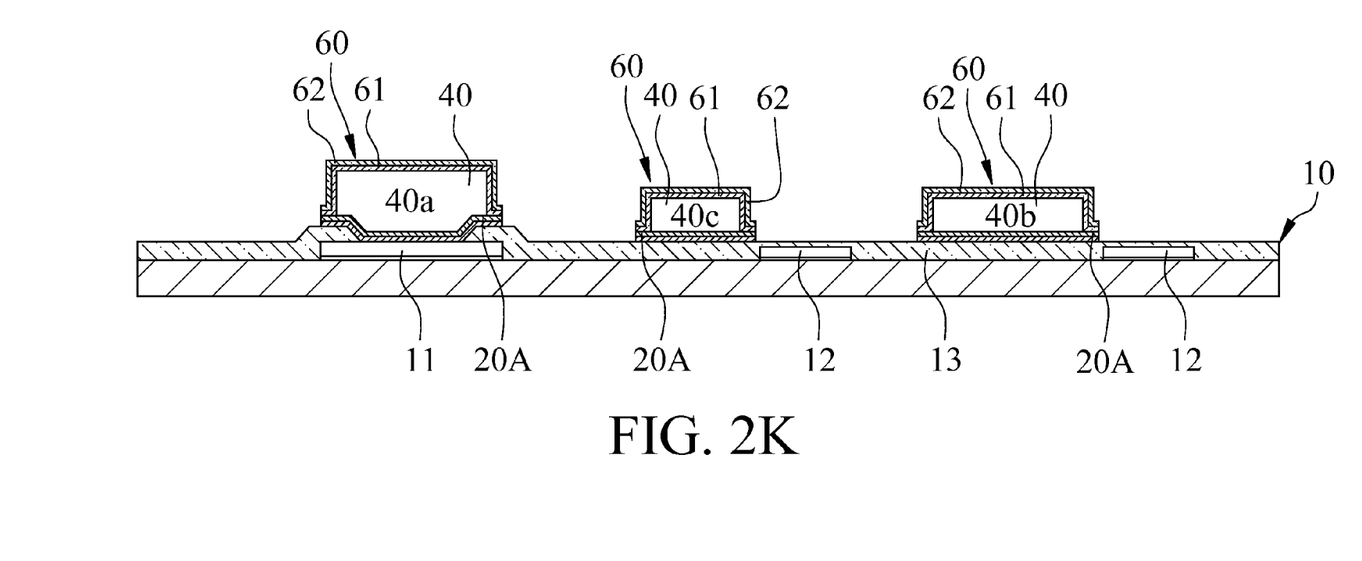
FIG. 2K is a schematic diagram illustrating a process of removing the conductive metal layer which is not covered by the connecting members and the anti-oxidant metal layer.

In this invention, the anti-oxidant metal layer 60 is formed on the top surface 41 and the lateral surface 42 of each of the connecting members 40 to prevent the connecting members 40 from oxidation. Therefore, a short phenomenon between adjacent connecting members 40 caused by electron migration can be avoided. Besides, forming the anti-oxidant metal layer 60 on the top surface 41 and the lateral surface 42 simultaneously may prevent galvanic erosion phenomenon.

In the step of forming the anti-oxidant metal layer 60, for the reason that the top surface 41, the lateral surface 42 of each of the connecting members 40 and the conductive metal layer 20 are covered by the anti-oxidant metal layer 60, the connecting interface A is formed between the anti-oxidant metal layer 60 and the conductive metal layer 20 positioned beneath the anti-oxidant metal layer 60. The connecting interface A may prevent the water mist from permeating into the connecting members 40 to avoid an oxidation phenomenon occurred between each of the connecting members 40 and the anti-oxidant metal layer 60.

While this invention has been particularly illustrated and described in detail with respect to the preferred embodiments thereof, it will be clearly understood by those skilled in the art that is not limited to the specific feature shown and described and various modifications and changes in form and details may be made without departing from the spirit and scope of this invention.

What is claimed is:

1. A process for forming an anti-oxidant metal layer on an electronic device comprising the steps of:
    providing a substrate having a plurality of bond pads and a protective layer, wherein the protective layer comprises a plurality of openings, and wherein the bond pads are revealed by the openings;
    forming a conductive metal layer on the substrate, such that the conductive metal layer is electrically connected with the bond pads, and such that the bond pads and the protective layer are covered by the conductive metal layer;
    forming a first photoresist layer on the conductive metal layer, such that the conductive metal layer is covered by the first photoresist layer;
    patterning the first photoresist layer to form a plurality of first apertures, a plurality of second apertures and a plurality of first grooves, wherein the first apertures are located on top of the bond pads, and wherein the conductive metal layer is revealed by the first apertures, the second apertures and the first grooves;
    forming a connecting member in each of the first apertures, each of the second apertures and each of the first grooves, wherein each of the connecting members comprises a top surface and a lateral surface, and wherein each of the connecting members is electrically with the conductive metal layer;
    removing the first photoresist layer to reveal the top surface and the lateral surface of each of the connecting members;
    forming a second photoresist layer on the conductive metal layer, wherein each of the connecting members is covered by the second photoresist layer;
    patterning the second photoresist layer to form a plurality of third apertures, a plurality of fourth apertures and a plurality of second grooves, wherein the third apertures are located on top of the bond pads, and wherein the top surface and the lateral surface of each of the connecting members are revealed by each of the third apertures, each of the fourth apertures and each of the second grooves;
    forming an anti-oxidant metal layer in each of the third apertures, each of the fourth apertures and each of the second grooves, wherein the top surface and the lateral surface of each of the connecting members is covered and sealed by the anti-oxidant metal layer so as to inhibit water mist from permeating into the connecting members;
    removing the second photoresist layer to reveal the anti-oxidant metal layer and the conductive metal layer; and
    using the connecting members and the anti-oxidant metal layer as a mask to remove the conductive metal layer which is not covered by the connecting members and the anti-oxidant metal layer.

2. The process for forming the anti-oxidant metal layer on the electronic device in accordance with claim 1, wherein in the step of forming the connecting member, each of the connecting members formed in each of the first apertures is a bump, each of the connecting members formed in each of the second apertures is a redistribution pad, and each of the connecting members formed in each of the first grooves is a redistribution trace.

3. The process for forming the anti-oxidant metal layer on the electronic device in accordance with claim 1, wherein in the step of patterning the second photoresist layer, the conductive metal layer is revealed by the third apertures, the fourth apertures and the second grooves.

4. The process for forming the anti-oxidant metal layer on the electronic device in accordance with claim 3, wherein in the step of forming the anti-oxidant metal layer, the anti-oxidant metal layer covers the conductive metal layer revealed by each of the third apertures, each of the fourth apertures and each of the second grooves.

5. The process for forming the anti-oxidant metal layer on the electronic device in accordance with claim 4, wherein in the step of forming the anti-oxidant metal layer, a connecting interface is formed between the anti-oxidant metal layer and the conductive metal layer beneath the anti-oxidant metal layer.

6. A process for forming an anti-oxidant metal layer on an electronic device comprising the steps of:
    providing a substrate having a plurality of bond pads and a protective layer;
    forming a conductive metal layer on the substrate, such that the conductive metal layer is electrically connected with the bond pads, and such that the bond pads and the protective layer are covered by the conductive metal layer;
    forming a first photoresist layer on the conductive metal layer, such that the conductive metal layer is covered by the first photoresist layer;
    patterning the first photoresist layer to form a plurality of apertures, wherein the apertures are located on top of the bond pads, and wherein the conductive metal layer is revealed by the apertures;
    forming a connecting member in each of the apertures, wherein each of the connecting members comprises a top surface and a lateral surface, and wherein each of the connecting members is electrically connected with the conductive metal layer;
    removing the first photoresist layer to reveal the top surface and the lateral surface of each of the connecting members;
    forming a second photoresist layer on the conductive metal layer, wherein each of the connecting members is covered by the second photoresist layer;
    patterning the second photoresist layer to form a plurality of apertures, wherein the apertures are located on top of the bond pads, and wherein the top surface and the lateral surface of each of the connecting members are revealed by each of the apertures;
    forming an anti-oxidant metal layer in each of the apertures, and wherein the top surface and the lateral surface of each of the connecting members is covered and sealed by the anti-oxidant metal layer so as to inhibit water mist from permeating into the connecting members;
    removing the second photoresist layer to reveal the anti-oxidant metal layer and the conductive metal layer; and
    using the connecting members and the anti-oxidant metal layer as a mask to remove the conductive metal layer which is not covered by each of the connecting members and the anti-oxidant metal layer.

7. The process for forming the anti-oxidant metal layer on the electronic device in accordance with claim 6, wherein in the step of patterning the second photoresist layer, each of the apertures reveals the conductive metal layer.

8. The process for forming the anti-oxidant metal layer on the electronic device in accordance with claim 7, wherein in the step of forming the anti-oxidant metal layer, the anti-oxidant metal layer covers the conductive metal layer revealed by the apertures.

9. The process for forming the anti-oxidant metal layer on the electronic device in accordance with claim 8, wherein in the step of forming the anti-oxidant metal layer, a connecting interface is formed between the anti-oxidant metal layer and the conductive metal layer beneath the anti-oxidant metal layer.

10. A process for forming an anti-oxidant metal layer on an electronic device comprising the steps of:

providing a substrate having a plurality of bond pads and a protective layer;

forming a conductive metal layer on the substrate, such that the protective layer is covered by the conductive metal layer;

forming a first photoresist layer on the conductive metal layer, such that the conductive metal layer is covered by the first photoresist layer;

patterning the first photoresist layer to form a plurality of apertures and a plurality of grooves, and such that the conductive metal layer is revealed by the apertures and the grooves;

forming a connecting member in each of the apertures and each of the grooves, wherein each of the connecting members comprises a top surface and a lateral surface, and wherein each of the connecting members is electrically connected with the conductive metal layer;

removing the first photoresist layer to reveal the top surface and the lateral surface of each of the connecting members;

forming a second photoresist layer on each of the connecting members, and wherein each of the connecting members is covered by the second photoresist layer;

patterning the second photoresist layer to form a plurality of apertures and a plurality of grooves, wherein the top surface and the lateral surface of each of the connecting members are revealed by each of the apertures and each of the grooves;

forming an anti-oxidant metal layer in each of the apertures and each of the grooves, such that the top surface and the lateral surface of each of the connecting members is covered and sealed by the anti-oxidant metal layer, so as to inhibit water mist from permeating into the connecting members;

removing the second photoresist layer to reveal the anti-oxidant metal layer and the conductive metal layer; and using the connecting members and the anti-oxidant metal layer as a mask to remove the conductive metal layer which is not covered by each of the connecting members and the anti-oxidant metal layer.

11. The process for forming the anti-oxidant metal layer on the electronic device in accordance with claim 10, wherein in the step of patterning the second photoresist layer, the conductive metal layer is revealed by the apertures and the grooves.

12. The process for forming the anti-oxidant metal layer on the electronic device in accordance with claim 11, wherein in the step of forming the anti-oxidant metal layer, the anti-oxidant metal layer covers the conductive metal layer revealed by each of the apertures and each of the grooves.

13. The process for forming the anti-oxidant metal layer on the electronic device in accordance with claim 12, wherein in the step of forming the anti-oxidant metal layer, a connecting interface is formed between the anti-oxidant metal layer and the conductive metal layer beneath the anti-oxidant metal layer.

\* \* \* \* \*